United States Patent
Hou

(10) Patent No.: US 9,072,173 B2
(45) Date of Patent: Jun. 30, 2015

(54) RIGID-FLEX PRINTED CIRCUIT BOARD AND METHOD FOR MAKING SAME

(71) Applicants: FuKui Precision Component (Shenzhen) Co., Ltd., Shenzhen (CN); Zhen Ding Technology Co., Ltd., Tayuan, Taoyuan (TW)

(72) Inventor: Ning Hou, Shenzhen (CN)

(73) Assignees: FuKui Precision Component (Shenzhen) Co., Ltd., Shenzhen (CN); Zhen Ding Technology Co., Ltd., Tayuan, Taoyuan (TW)

( * ) Notice: Subject to any disclaimer, the term of this patent is extended or adjusted under 35 U.S.C. 154(b) by 3 days.

(21) Appl. No.: 14/140,456

(22) Filed: Dec. 24, 2013

(65) Prior Publication Data

US 2014/0182900 A1    Jul. 3, 2014

(30) Foreign Application Priority Data

Dec. 28, 2012 (CN) .......................... 2012 1 0582448

(51) Int. Cl.
| | |
|---|---|
| H05K 1/00 | (2006.01) |
| H05K 3/02 | (2006.01) |
| H05K 3/00 | (2006.01) |
| H05K 3/46 | (2006.01) |
| H05K 3/36 | (2006.01) |

(52) U.S. Cl.
CPC ......... *H05K 3/0097* (2013.01); *Y10T 29/49155* (2015.01); *H05K 3/368* (2013.01); *H05K 3/4691* (2013.01); *H05K 2201/09145* (2013.01); *H05K 2201/209* (2013.01); *H05K 2203/1461* (2013.01); *H05K 3/4652* (2013.01)

(58) Field of Classification Search
CPC ... H05K 3/4691; H05K 3/0097; H05K 3/368; H05K 2201/09145; H05K 2203/1461; H05K 3/4652; H05K 2201/209; Y10T 29/49155
USPC ................. 361/729, 736, 740, 749–751, 759; 174/254
See application file for complete search history.

(56) References Cited

U.S. PATENT DOCUMENTS

| | | | | |
|---|---|---|---|---|
| 2007/0012475 | A1* | 1/2007 | Kawaguchi et al. | 174/255 |
| 2008/0093118 | A1* | 4/2008 | Takahashi et al. | 174/264 |
| 2009/0117458 | A1* | 5/2009 | Yun | 429/178 |
| 2010/0139955 | A1* | 6/2010 | Long et al. | 174/257 |
| 2011/0255249 | A1* | 10/2011 | Lee et al. | 361/749 |
| 2012/0051004 | A1* | 3/2012 | Tokuda et al. | 361/749 |
| 2012/0325524 | A1* | 12/2012 | Naganuma et al. | 174/254 |
| 2013/0014982 | A1* | 1/2013 | Segawa et al. | 174/263 |

* cited by examiner

*Primary Examiner* — Hoa C Nguyen
(74) *Attorney, Agent, or Firm* — Novak Druce Connolly Bove + Quigg LLP

(57) ABSTRACT

An RFPCB includes a reinforcement layer and at least two FPCBs spliced together to match the reinforcement layer in shape and size. The FPCBs are adhered onto the reinforcement layer. The reinforcement layer includes circuits connected with the FPCB and has portions removed to obtain a desired flexibility.

14 Claims, 9 Drawing Sheets

RIGID-FLEX PRINTED CIRCUIT BOARD AND METHOD FOR MAKING SAME

BACKGROUND

1. Technical Field

The present disclosure relates to rigid-flex printed circuit boards (RFPCBs), and particularly to an RFPCB of low cost and a method for making the RFPCB.

2. Description of Related Art

To form RFPCBs, raw boards of flexible printed circuit boards (FPCBs) and rigid printed circuit boards (RPCBs) are provided and formed with respective circuits to obtain the FPCBs and the RPCBs. Then, the FPCBs are combined with the RPCBs to obtain the RFPCBs. However, both the raw boards of the FPCBs and the RPCBs have standard lengths and widths, which may not match each other. Thus, portions of the FPCBs or of the RPCBs may be wasted, which increases a cost of the RFPCBs.

Therefore, it is desirable to provide an RFPCB and a method for making the RFPCB to overcome the above-mentioned problems.

BRIEF DESCRIPTION OF THE DRAWINGS

Many aspects of the present disclosure can be better understood with reference to the following drawings. The components in the drawings are not necessarily drawn to scale, the emphasis instead being placed upon clearly illustrating the principles of the present disclosure.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean "at least one." The references "a plurality of" and "a number of" mean "at least two."

Embodiments of the present disclosure will be described with reference to the drawings.

Figure 1:
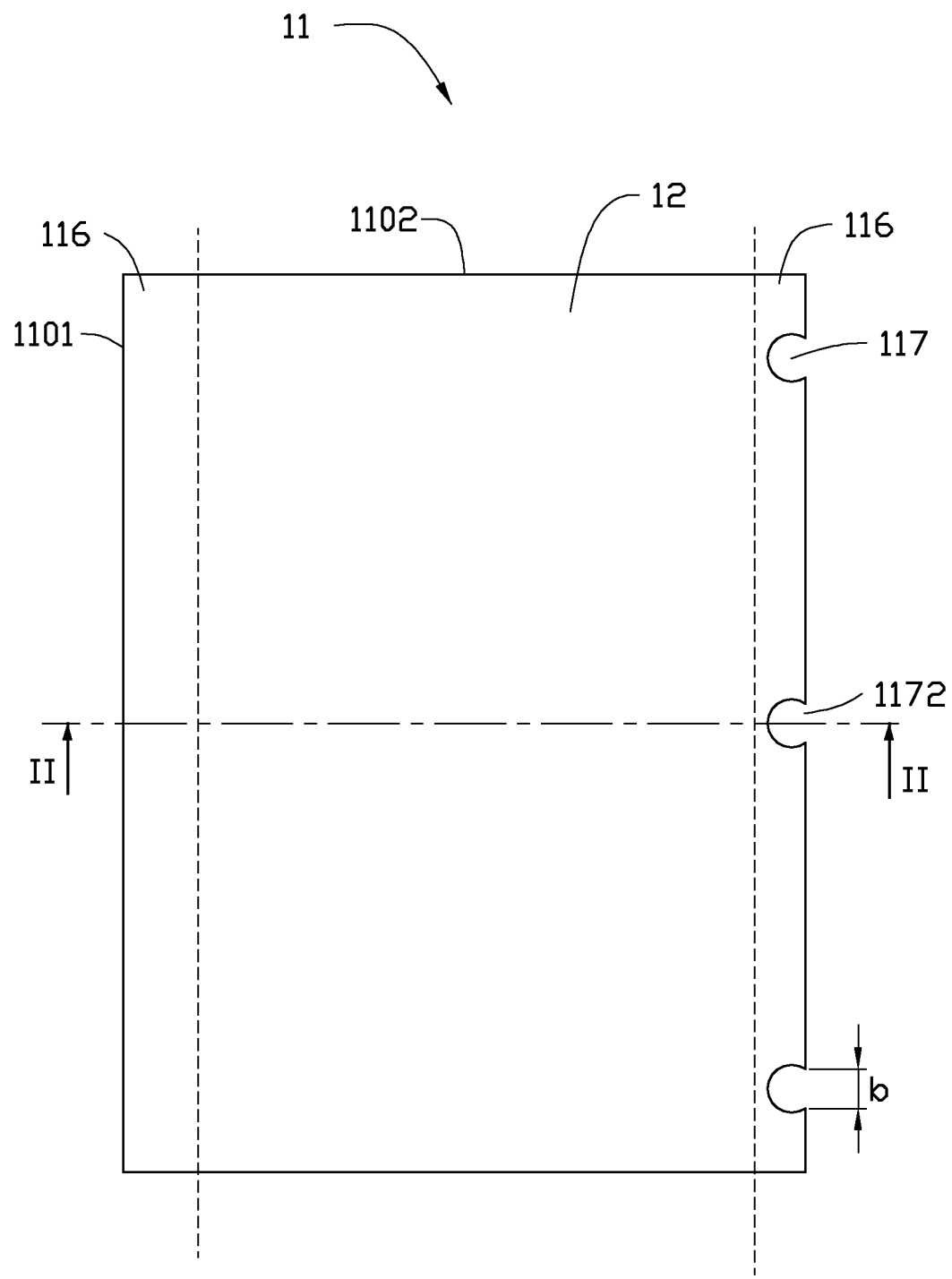
FIG. 1 is a top view of an embodiment of a first FPCB.
Figure 2:
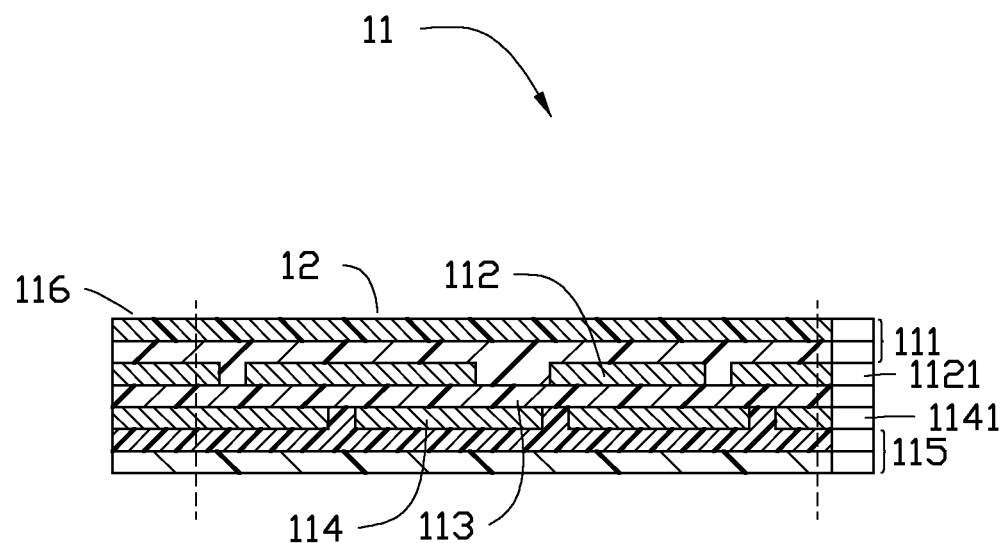
FIG. 2 is a cross-sectional view of the first FPCB of FIG. 1.

A method for making a first RFPCB 310 and a second RFPCB 320 (both shown in FIG. 9) includes the following steps:

In step 1, referring to FIGS. 1-2, a substantially rectangular first FPCB 11 is provided. A number of substantially C-shaped cutouts 117 are defined in a side of the first FPCB 11 by stamping.

In one embodiment, the first FPCB 11 includes from top to bottom, a first cover layer 111, a first inner circuit layer 112, a first flexible isolative layer 113, a second inner circuit layer 114, and a second cover layer 115. Thus, the first FPCB 11 includes two inner circuit layers (the first inner circuit layer 112 and the second inner circuit layer 114). In other embodiments, the first FPCB 11 can include only one or more than two inner circuit layers according to actual needs.

In one embodiment, the first FPCB 11 is divided into two first engaging portions 116 and one first FPCB unit 12, such that the first FPCB unit 12 is located between the two first engaging portions 116. In the two first engaging portions 116, portions of the first FPCB 11 are disabled.

A first conductive scrap 1121 of the first inner circuit layer 1121 located within the first engaging portions 116 is disabled from transmitting electric signals. A second conductive scrap 1141 of the second inner circuit layer 114 located within the first engaging portions 116 is also disabled from transmitting electric signals.

In one embodiment, the first FPCB 11 is made from a raw board (not shown) cut from a flexible board tape (not shown) having a standard width, such as about 250 millimeters (mm) or about 500 mm. The first FPCB 11 includes two opposite first sides 1101 and two opposite second sides 1102. A length of the first sides 1101 can be changed according to actual needs. In one embodiment, a size of the first FPCB 11 is about 250 mm*350 mm.

In one embodiment, a number of the cutouts 117 is three. The cutouts 117 are equidistantly arranged along one of the first sides 1101 and located within the corresponding first engaging portion 116.

In the illustrated embodiment, the cutouts 117 are defined through the first cover layer 111, the first conductive scrap 1121, the first flexible isolative layer 113, the second conductive scrap 1141, and the second cover layer 115. In another embodiment, the cutouts 117 are defined through the first cover layer 111, the first conductive scrap 1121, the first flexible isolative layer 113, and the second cover layer 115. In another embodiment, the cutouts 117 are defined through the first cover layer 111, the first flexible isolative layer 113, the second conductive scrap 1141, and the second cover layer 115.

The cutouts 117 are substantially circular, and a central angle of a circular side of each of the cutouts 117 is larger than about 180 degrees. Each cutout 117 satisfies the following condition: Lo<2Rc, wherein Rc is a radius of the cutout 117, and Lo is a length of an opening 1172 of the cutout 117 at the first side 1101. As such, the opening 1172 is shorter than a diameter of the cutout 177, and thus can function as an engaging structure. In one embodiment, Lo is about 1 mm.

Figure 3:
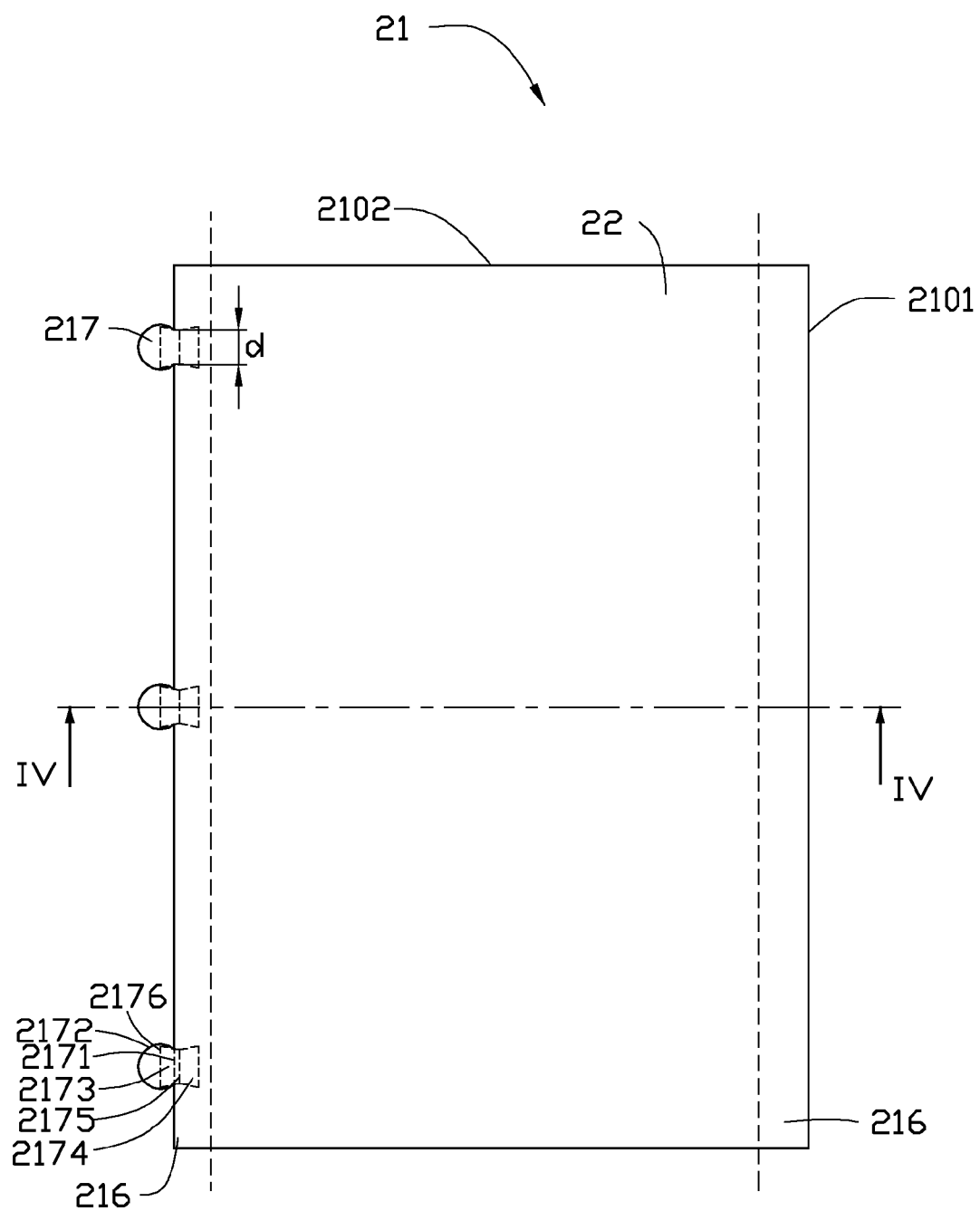
FIG. 3 is a top view of an embodiment of a second FPCB.
Figure 4:
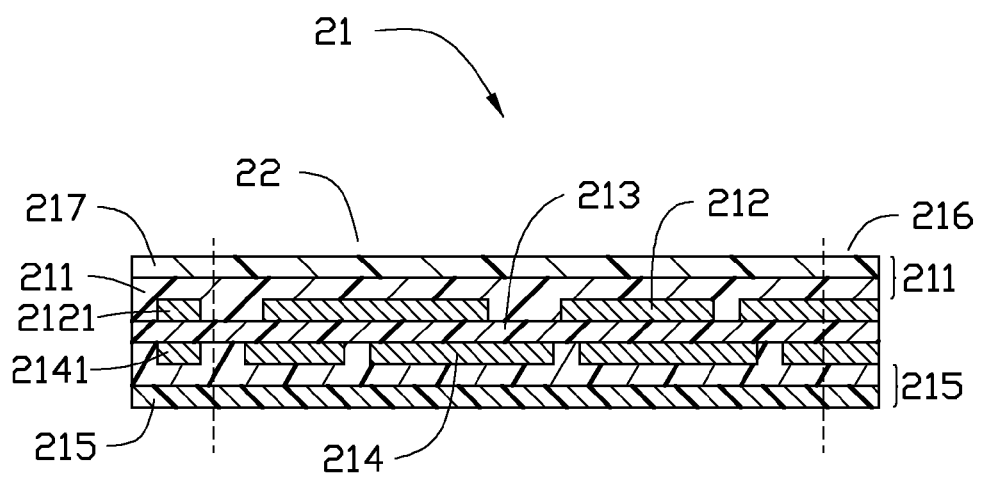
FIG. 4 is a cross-sectional view of the second FPCB of FIG. 3.

In step 2, referring to FIGS. 3-4, a substantially rectangular second FPCB 21 is provided. In one embodiment, the second FPCB 21 is divided into two second engaging portions 216 and one second FPCB unit 22, such that the second FPCB unit 22 is located between the two second engaging portions 216. A number of substantially C-shaped protrusions 217 is formed in a side of the second FPCB 21 by stamping. The C-shaped protrusions 217 correspond to the C-shaped cutouts 117.

In one embodiment, the second FPCB 21 includes from top to bottom, a third cover layer 211, a third inner circuit layer 212, a second flexible isolative layer 213, a fourth inner circuit layer 214, and a fourth cover layer 215. Thus, the second FPCB 21 is a two-layer FPCB having two circuit layers (the third and the fourth inner circuit layers 212, 214). In one embodiment, the second FPCB 21 can include one or more than two inner circuit layers according to actual needs.

A third conductive scrap 2121 of the third inner circuit layer 212 located within the second scrap zones 216 is disabled from transmitting electric signals. A fourth conductive scrap 1141 of the fourth inner circuit layer 214 located within the second engaging portions 216 is also disabled from transmitting electric signals.

The second FPCB 21 is made in substantially a similar manner as the first FPCB 11. The second FPCB 21 includes two opposite third sides 2101 and two opposite fourth sides 2102. A length of the third sides 2101 can be changed according to actual needs. In one embodiment, a size of the second FPCB 21 is about 250 mm*350 mm.

In the illustrated embodiment, a number of the protrusions 217 is three. The protrusions 217 are equidistantly arranged along one of the third sides 2101 and located within the corresponding second engaging portion 216. Each protrusion 217 spatially corresponds to one cutout 117 in shape and size.

To form the protrusions 217, an actual length of the fourth sides 2102 is slightly shorter than an actual length of the second sides 1102.

Each protrusion 217 is substantially circular and includes a straight side 2171 and a circular portion 2172 connected to the straight side 271. A central angle of the circular side 2172 is substantially equal to the central angle of the cutout 117. Each protrusion 217 satisfies the following condition: $Ls<2Ri$ and $0<Rc-Ri\leq0.1$ mm, wherein Ri is a radius of the protrusion 217, and Ls is a length of the straight side 2171. Thus, a length of the radius Ri of the protrusion 217 is slightly smaller than a size of the radius Rc of the cutout 117.

The second FPCB 21 includes a first trapezoidal zone 2173 and a second trapezoidal zone 2174, both of which have a common side 2175 and are symmetrical about the common side 2175. A long side 2176 of the first trapezoidal zone 2173 opposite to the common side 2175 is located within the protrusion 217, and is substantially equal to or slightly smaller than a diameter of the protrusion 217. The long side 2176 and the common side 2175 are substantially parallel to the straight side 2171. The common side 2175 is located outside the protrusion 217. The first trapezoidal zone 2173 satisfies the following condition: $0\leq Ds\leq 50$ micrometers (μm), wherein Ds is a distance between the common side 2175 and the straight side 2171 of the first trapezoidal zone 2173, to leave a gap between the protrusion 217 and the cutout 117 when the protrusion 217 is received in the cutout 117, such that the protrusion 217 is not forced out of the cutout 117 in case of thermal expansion of the protrusions 217.

In the illustrated embodiment, the first trapezoidal zone 2173 includes, in this order from a side to another, the third cover layer 211, the third conductive scrap 2121, the second flexible isolative layer 213, the fourth conductive scrap 2141, and the fourth cover layer 215. In another embodiment, each first trapezoidal zone 2173 includes from top to bottom, the third cover layer 211, the third conductive scrap 2121, the second flexible isolative layer 213, and the fourth cover layer 215. In another embodiment, the first trapezoidal zone 2173 includes, in this a side to another, the third cover layer 211, the second flexible isolative layer 213, the fourth conductive scrap 2141, and the fourth cover layer 215. Thus, the first trapezoidal zone 2173 is reinforced by the third conductive scrap 2121, the fourth conductive scrap 2141, or both. Because the third conductive scrap 2121 and the fourth conductive scrap 2141 are made of metal, deformation of the protrusion 217 is avoided. Thus, the protrusion 217 is stably received into the cutout 117.

The second trapezoidal zone 2174 is substantially similar to the first trapezoidal zone 2173.

In one embodiment, materials of portions of the protrusions 217 can be changed to reinforce the protrusions 217 in the cutouts 117.

Figure 5:
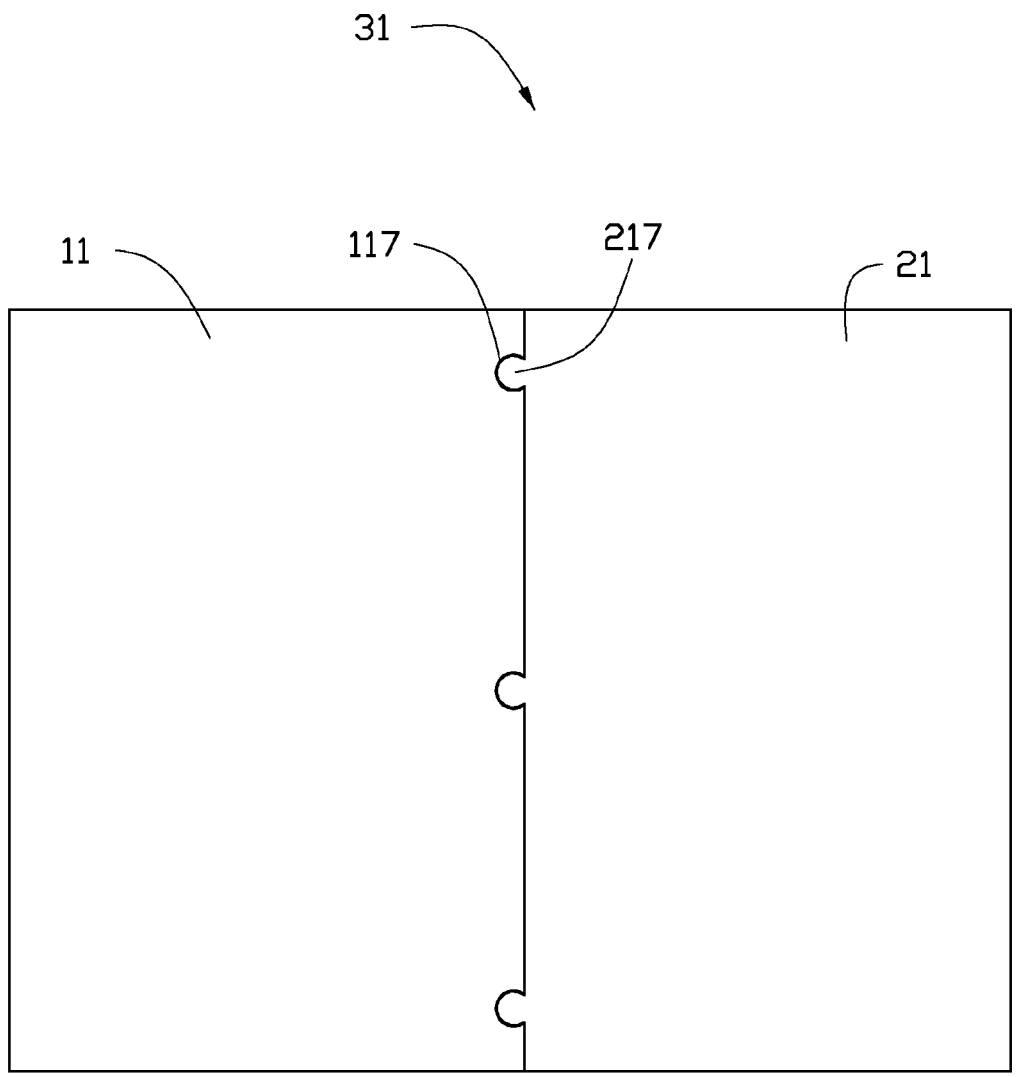
FIG. 5 is a top view of a third FPCB formed from the first FPCB of FIG. 1 and the second FPCB of FIG. 3.

In step 3, referring to FIG. 5, the protrusions 217 are received into the cutouts 117. Thus, the second FPCB 21 and the first FPCB 11 cooperatively form a third FPCB 31. The third FPCB 31 is substantially rectangular. A width of the third PFCB 31 is substantially equal to the lengths of the first side 1101 and of the third side 2101. A length of the third FPCB 31 is slightly smaller than a total length of the second side 1102 and the fourth side 2102.

In other embodiments, each of the first FPCB 11 and the second FPCB 21 can form the cutouts 117 and the protrusions 217 in more than one side thereof, and thus can be combined with more than one of the first FPCB 11 or the second FPCB 21.

Figure 6:
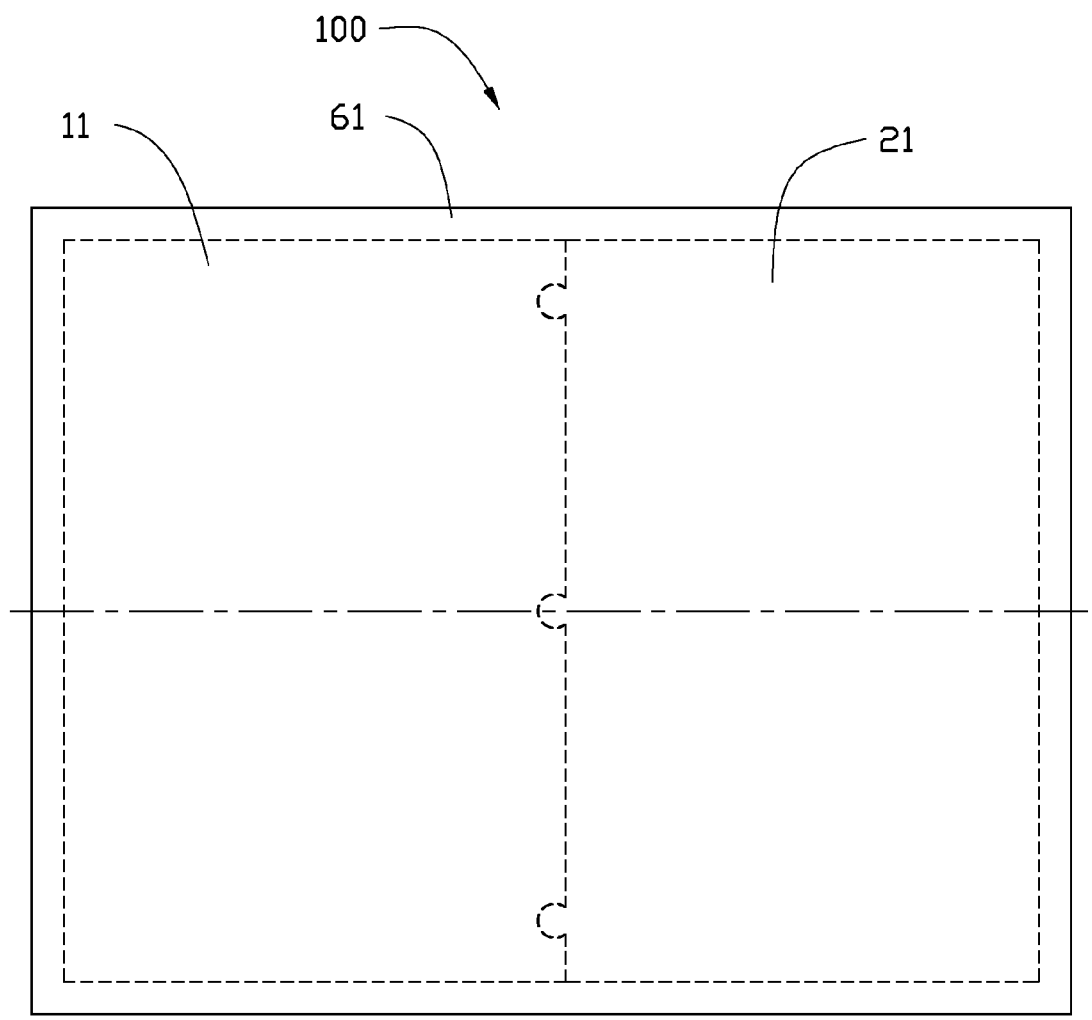
FIG. 6 is a top view of a first semifinished board of the third FPCB of FIG. 5.
Figure 7:
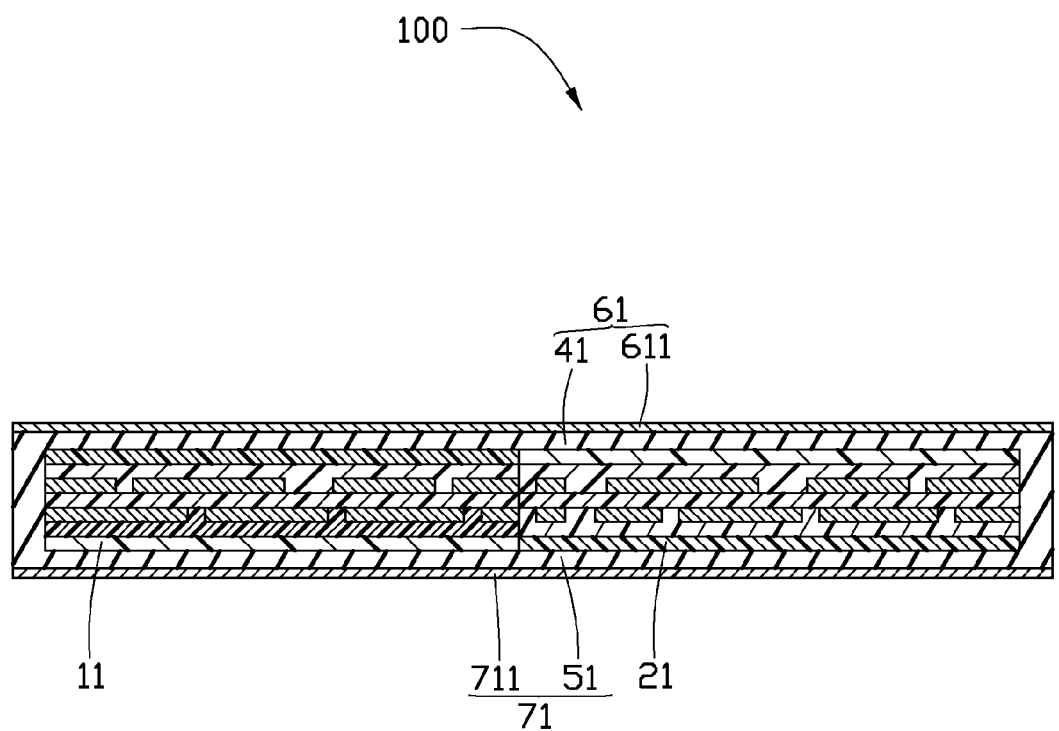
FIG. 7 is a cross-sectional view of the first semifinished board of FIG. 6.

In step 4, referring to FIGS. 6-7, a first reinforcement layer 61 and a second reinforcement layer 71 are provided. The third FPCB 31 is located between the first and second reinforcement layers 61, 71 to form a first semifinished board 100 of the RFPCBs 310, 320. In one embodiment, the first semifinished board 100 is formed by a thermal pressing technology and is substantially rigid.

The first reinforcement layer 61 includes a first copper foil 611 and a first adhesive layer 41. The first adhesive layer 41 binds the copper foil 611 to the third FPCB 31. The second reinforcement layer 71 includes a second copper foil 711 and a second adhesive layer 51. The second adhesive layer 51 binds the second copper foil 711 to the third FPCB 31.

The first reinforcement layer 61 and the second reinforcement layer 71 are substantially identical to each other in shape and size and are slightly larger than the third FPCB 31.

The first adhesive layer 41 and the second adhesive layer 51 can be separately formed and then combined with the first copper foil 611 and the second copper foil 711, respectively. In one embodiment, the first adhesive layer 41 and the second adhesive layer 51 are semi-cured before being applied to the first copper foil 611 and the second copper foil 711, and can be epoxy, acrylic resin, fiberglass cloth resin, or other suitable adhesive. The first adhesive layer 41 and the second adhesive layer 51 are fully cured after they are applied.

To increase a binding strength between the third FPCB 31 and the first and second adhesive layers 41, 51, the third FPCB 31 can be plasma-treated before being bound to the first and second adhesive layers 41, 51.

In other embodiments, the first reinforcement layer 61 or the second reinforcement layer 71 can be omitted, such that only the first reinforcement layer 61 or the second reinforcement layer 71 is applied.

Figure 8:
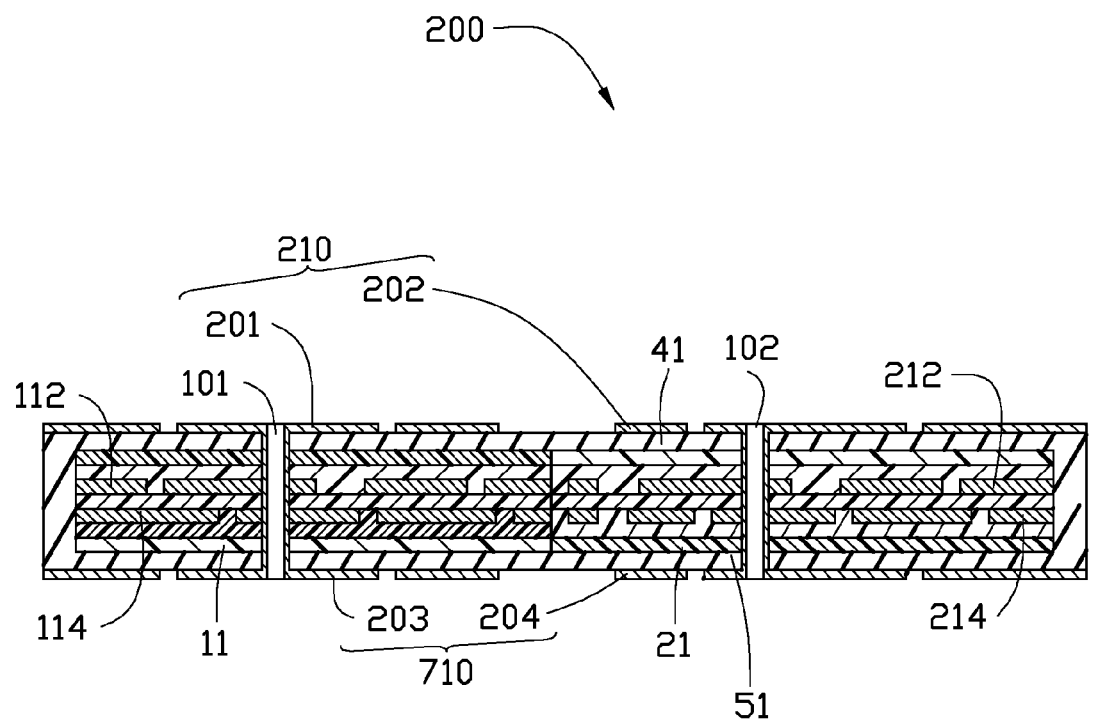
FIG. 8 is a cross-sectional view of a second semifinished board made from the first semifinished board of FIG. 7.

In step 5, referring to FIG. 8, a first via 101 and a second via 102 are defined through the first semifinished board 100. A first circuited layer 210 is formed from the first copper foil 611, and a second circuited layer 710 is formed from the second copper foil 711. The first circuited layer 210 includes a first circuit pattern 201 and a second circuit pattern 202. The second circuited layer 710 includes a third circuit pattern 203 and a fourth circuit pattern 204. The first via 101 electrically connects the first circuit pattern 201, the first inner circuit layer 112, the second inner circuit layer 114, and the third circuit pattern 203 to each other. The second via 102 electrically connects the second circuit pattern 202, the third inner circuit layer 212, the fourth inner circuit layer 214, and the fourth circuit pattern 204 to each other. Thus, a second semifinished board 200 is formed from the first semifinished board 100. In one embodiment, the second semifinished board 200 is substantially rigid.

In one embodiment, lithophotography and etching technologies are employed to form the first circuited layer 210 and the second circuited layer 710. In one embodiment, each first circuit pattern 201 and each third circuit pattern 203 corresponds to one first FPCB unit 12. Likewise, each second circuit pattern 202 and each fourth circuit pattern 204 corresponds to one second FPCB unit 22.

In other embodiments, numbers of the first through fourth circuit patterns 201-204 can be more than one, and can be identical or not identical to each other.

In another embodiment, the first via 101 and the second via 102 selectively connect the first circuit pattern 201 and the first inner circuit layer 112 together.

In another embodiment, the first via 101 and the second via 102 selectively connect the first circuit pattern 201, the first inner circuit layer 112, and the second inner circuit layer 114 together.

In another embodiment, the first via 101 and the second via 102 selectively connect the first circuit pattern 201, the first inner circuit layer 112, the second inner circuit layer 114, and the third circuit pattern 203 together.

In another embodiment, the first via 101 and the second via 102 selectively connect the second circuit pattern 202 and the third inner circuit layer 212.

In another embodiment, the first via 101 and the second via 102 selectively connect the second circuit pattern 202, the third inner circuit layer 212, and the fourth inner circuit layer 214.

In another embodiment, the first via 101 and the second via 102 selectively connect the second circuit pattern 202, the third inner circuit layer 212, the fourth inner circuit layer 214, and the fourth circuit pattern 204.

The first-fourth circuit patterns 201-204 of the second semifinished board 200 can be coated with solder resisting patterns (not shown) and/or plated with gold.

Figure 9:
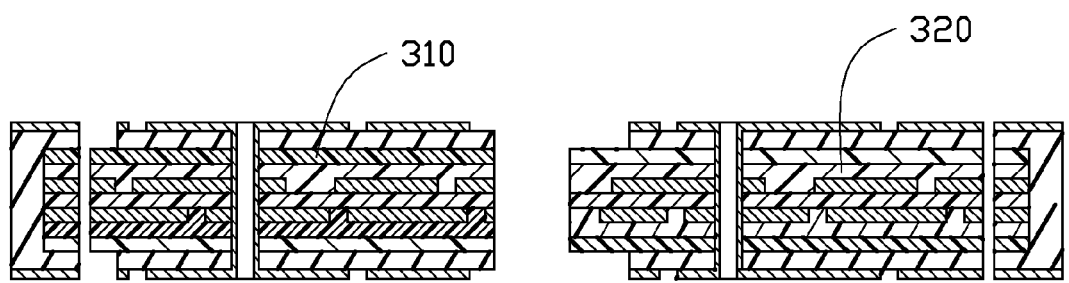
FIG. 9 is a cross-sectional view of RFPCBs made from the second semifinished board of FIG. 8.

In step 6, referring to FIG. 9, portions of the first reinforcement layer 61 and of the second reinforcement layer 71 are removed to expose corresponding portions of the first FPCB unit 12 and of the second FPCB unit 22, to obtain a desired flexibility. In one embodiment, the first and second RFPCBs 310, 320 are formed by cutting along a boundary line between the first FPCB unit 12 and the second FPCB unit 22. The RFPCB 310 includes the first FPCB unit 12, and the second RFPCB 320 includes the second FPCB unit 22.

In other embodiments, the semifinished board 200 just includes one RFPCB. As such, the cutting process in step 6 is omitted after the desired parts of the first reinforcement layer 61 and of the second reinforcement layer 71 are removed.

Because the FPCBs (the first FPCB 11 and the second FPCB 21) are first spliced and then combined with RPCBs (the first reinforcement layer 61 and the second reinforcement layer 71), size matching between the FPCBs and the corresponding RPCBs is achieved. As such, an amount of wasted material and cost are reduced.

It will be understood that the above particular embodiments are shown and described by way of illustration only. The principles and the features of the present disclosure may be employed in various and numerous embodiments thereof without departing from the scope of the disclosure. The above-described embodiments illustrate the possible scope of the disclosure but do not restrict the scope of the disclosure.

What is claimed is:

1. A rigid-flex printed circuit board (RFPCB), comprising:
   a reinforcement layer; and
   at least two FPCBs spliced together to match with the reinforcement layer in shape and size and pasted onto the reinforcement layer;
   wherein the reinforcement layer comprises circuits connecting with the FPCBs and comprises desired parts removed to obtain a desired flexibility.

2. A method for making a rigid-flex printed circuit board (RFPCB), the method comprising:
   providing a first FPCB, the first FPCB defining a plurality of cutouts at one side thereof and comprising a first FPCB unit;
   providing a second FPCB, the second FPCB comprising a plurality of protrusions corresponding to the cutouts at one side thereof and comprising a second FPPCB unit;
   splicing the second FPCB with the first FPCB by engagement between the cutouts and the protrusions to obtain a third FPCB;
   providing a reinforcement layer, the reinforcement layer having a shape and size matching with the third FPCB, the reinforcement layer comprising a copper foil and an adhesive layer;
   thermally pressing the third FPCB onto the reinforcement layer, with the adhesive layer bonding the copper foil to the third FPCB to obtain a first semifinished board;
   forming a first circuit pattern corresponding to the first FPCB unit and a second circuit pattern corresponding to the second FPCB from the copper foil and connecting the first circuit pattern and the first FPCB unit, and connecting the second circuit pattern and the second FPCB unit in desired manner to obtain a second semifinished board, and;
   removing desired parts of the reinforcement layer to expose corresponding parts of the first FPCB unit and the second FPCB unit, thus to obtain the RFPCB.

3. The method of claim 2, wherein each of the cutouts is circular and a central angle of each of the cutouts is larger than about 180 degrees.

4. The method of claim 3, wherein each of the protrusions is circular and a central angle of each of the protrusions is substantially equal to the central angle of each of the cutouts.

5. The method of claim 4, wherein the cutouts and the protrusions satisfy a condition formula: $0 < Rc - Ri \leq 0.1$ mm, where Rc and Ri are radii of the cutouts and the protrusions respectively.

6. The method of claim 5, wherein each of the protrusions comprises a straight side and a circular side, the second FPCB comprises a plurality of first trapezoidal zones, each of which is at least partially located within one of the protrusions, the first trapezoidal zone comprises at least one metal layer, the first trapezoidal zone comprises a long side located in the protrusion and an opposite common side located outside the protrusion, and the first trapezoidal zone satisfies a condition formula: $0 \leq Ds \leq 50$ μm, where Ds is a distance between the common side and the straight side.

7. The method of claim 6, wherein the second FPCB comprises a second trapezoidal zone which is substantially symmetrical with the first trapezoidal about the common side, and the second trapezoidal zone comprises at least one metal layer.

8. The method of claim 2, wherein the second semifinished board comprises a first RFPCB and a second RFPCB after the desired parts of the reinforcement layer are removed, and the method comprises:
   separating the first RFPCB and the second RFPCB by stamping to cut along a boundary line between the first FPCB unit and the second FPCB unit.

9. The method of claim 2, wherein the first circuit pattern and the first FPCB unit are connected by defining a first via, and the second circuit pattern and the second FPCB unit are connected by defining a second via.

10. The method of claim 2, wherein additional reinforcement layer is provided and the third FPCB are sandwiched between the reinforcement layers by thermal pressing.

11. The method of claim 2, wherein the first FPCB and the second FPCB are two-layer FPCB.

12. The method of claim 2, wherein the reinforcement layer is slightly larger than the third FPCB.

13. The method of claim 2, wherein the cutouts and the protrusions are formed by stamping.

14. The method of claim 2, wherein the adhesive layer and the copper foil are separatedly formed and then combined together.

\* \* \* \* \*